US007548178B2

(12) United States Patent
Delano

(10) Patent No.: US 7,548,178 B2
(45) Date of Patent: Jun. 16, 2009

(54) METHOD AND APPARATUS FOR ADC SIZE AND PERFORMANCE OPTIMIZATION

(75) Inventor: Cary L. Delano, Los Altos, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 11/308,201

(22) Filed: Mar. 10, 2006

(65) Prior Publication Data

US 2007/0210947 A1 Sep. 13, 2007

(51) Int. Cl.
*H03M 3/00* (2006.01)

(52) U.S. Cl. ........................ 341/143; 341/155; 341/118

(58) Field of Classification Search ................ 341/143, 341/118, 120, 155
See application file for complete search history.

(56) References Cited

U.S. PATENT DOCUMENTS 4,926,178 A 5/1990 Mallinson
5,196,853 A * 3/1993 Abbiate et al. .............. 341/143
5,198,817 A 3/1993 Walden et al.
5,598,158 A * 1/1997 Linz ........................... 341/143
5,654,668 A 8/1997 Botti et al.
5,708,390 A 1/1998 Dunnebacke
5,768,315 A 6/1998 Mittel et al. ................ 375/247
5,818,377 A 10/1998 Wieser
5,841,822 A 11/1998 Mittel et al. ................ 375/350
6,107,886 A 8/2000 Kusakabe et al.
6,137,431 A 10/2000 Lee et al.
6,218,977 B1 4/2001 Friend et al.
6,249,236 B1 * 6/2001 Lee et al. .................... 341/143
6,489,913 B1 12/2002 Hansen et al. .............. 341/156
6,496,128 B2 12/2002 Wiesbauer et al. .......... 341/143
6,611,221 B1 8/2003 Soundarapandian et al.
6,642,873 B1 11/2003 Kuang
6,696,999 B2 * 2/2004 Ollos et al. ................. 341/143
6,697,003 B1 2/2004 Chen
6,825,784 B1 11/2004 Zhang ........................ 341/131
6,839,010 B1 1/2005 Tsyrganovich .............. 341/143
6,856,266 B2 2/2005 Schwartz et al. ............ 341/143
6,888,358 B2 5/2005 Lechner et al. ............. 324/607
6,888,484 B2 5/2005 Kiss et al.
6,891,488 B1 5/2005 McDaniel et al.
6,897,796 B2 5/2005 Dias et al. ................... 341/143
6,907,374 B1 6/2005 Tsyrganovich .............. 702/107
6,924,756 B2 8/2005 Viswanathan ............... 341/143
6,975,259 B1 * 12/2005 Jensen ........................ 341/143
6,980,139 B2 * 12/2005 Doerrer et al. .............. 341/118
6,998,910 B2 * 2/2006 Hezar et al. ................... 330/10
7,015,843 B2 3/2006 Jelonnek ..................... 341/143

(Continued)

*Primary Examiner*—Linh V Nguyen

(57) ABSTRACT

A sigma delta analog-to-digital converter (ADC) to convert an analog converter input signal to a digital converter output signal. Multiple integrator stages, including at least a first and a final one, each receive an analog input signal and an analog feedback signal and output an integrated signal. The integrator stages are serially ordered to receive the converter input signal and then preceding of the integrated signals. A quantizer receives the integrated signal of the final or multiple integrator stages and provides the converter output signal. A feedback system also receives the converter output signal and provides the respective analog feedback signals to at least one of the integrator stages. The feedback system particularly includes resisters arrayed so that at least one is in the paths of all of the analog feedback signals and others are only in the paths of each individual analog feedback signal.

15 Claims, 4 Drawing Sheets

U.S. PATENT DOCUMENTS 7,024,171 B2 4/2006 Gibbs .......................... 455/260
7,030,797 B2 4/2006 Jelonnek ...................... 341/143
7,049,990 B2 * 5/2006 Ranganathan ............... 341/143
7,064,698 B2 6/2006 Locher et al. ............... 341/143
7,068,197 B1 6/2006 Tsyrganovich .............. 341/143
7,068,198 B2 6/2006 Hong et al. ................. 341/143
7,123,177 B2 * 10/2006 Cheng et al. ................ 341/143
7,142,142 B2 * 11/2006 Petersen et al. ............. 341/143
2005/0068213 A1 * 3/2005 Fontaine et al. ............. 341/143
2005/0237233 A1 * 10/2005 Muhammad ................ 341/143
2006/0071834 A1 * 4/2006 del Mar Charmarro Marti et al. .......................... 341/143
2006/0261901 A1 * 11/2006 Mazda et al. ................. 331/16

* cited by examiner

1st-order, N-level Sigma Delta ADC

3rd-order, N-bit Sigma Delta ADC

DAC feedback resisters in 2-bit and 3-bit Sigma Delta ADCs

Weighted-resister DAC

R-2R ladder DAC

METHOD AND APPARATUS FOR ADC SIZE AND PERFORMANCE OPTIMIZATION

TECHNICAL FIELD

The present invention relates generally to coded data generation or conversion, and more particularly to sigma delta analog-to-digital converters.

BACKGROUND ART

Many electronic systems today include one or more analog-to-digital converters (ADCs) or digital-to-analog converters (DACs), and all indications are that the use of these important devices is increasing and will continue to do so for some time. This has particularly motivated manufacturers to search for ways to improve these devices, for example, by making them more powerful, faster, efficient, flexible, and less expensive.

Of present interest is the sigma delta ADC, an over sampling ADC that is also sometimes referred to as a sigma delta modulator, delta sigma ADC, and delta sigma modulator. FIG. 1 (prior art) is a schematic block diagram depicting a conventional 1st-order, N-level sigma delta ADC 10. The sigma delta ADC 10 here is a single-loop device. Multi-loop designs also exist, but the principles discussed herein are generally extendable to those in straightforward manner.

The basic principle of the multi-level sigma-delta ADC is as follows. An analog input signal ($V_{IN}$) is fed into the device at a summer ($\Sigma$), and the output of the summer is coupled to an integrator ($\int$) (often generically termed a "loop filter" in the literature). The summer can simply be a circuit node at the input to the integrator, rather than a discrete device, and the combination is then often termed an "integration stage." The output of the integrator is still an analog signal which is coupled to a N-level flash ADC (generically, a quantizer) that converts it into a digital signal.

In principle, the digital output signal from a N-level flash ADC can simply be in M-bit binary format where $M={}_2(N)$. In practice, however, it is usually in an N-bit format where all of the bits are equally weighted, such as thermometer code. A 4-bit binary value converted into thermometer code has 15 equally weighted levels (the "all bits off" state does not require an output bit, so $2^N-1$ bits suffices). A value of "8" can therefore be represented in thermometer code with the bottom 8 bits set to "1" and the top 7 bits set to "0. An inverted form, where the bottom bits are set to "0" and the top bits are set to "1" may also be used.

Continuing with FIG. 1, the digital output of the N-level flash ADC is coupled to down-stream circuitry that typically performs digital filtering, decimation, and translation into a binary data word that the sigma delta ADC 10 outputs. Such circuitry is not particularly germane here and is therefore not generally discussed further.

What is of present interest is that the digital output of the N-level flash ADC is also fed back through a N-level DAC (generically, a feedback system), where it is converted back into an analog feedback signal that is provided to a second (negative) input terminal of the summer to complete a feedback loop. The N-level DAC includes a plurality of elements, such as capacitors, resistors, current sources, and the like, that must be configured to selectively release energy to produce the analog feedback signal for the summer.

Unfortunately, variation inevitably exists among these elements due to manufacturing tolerances, temperature, aging, etc. Although the absolute error from one element to another can be tightly controlled, the cumulative effect of this is termed "element mismatch" and is often significant enough that it poses a major challenge to the designers of multi-level sigma delta ADCs.

Numerous techniques are used to address element mismatch. Employing an equally weighted code helps, since the mismatch errors among the elements somewhat tends to cancel out. Other techniques include laser trimming of elements in manufacturing, calibration and recalibration processes in the field, and digital error correction in the down-stream circuitry. Dynamic element matching (DEM) algorithms, including data weighted averaging (DWA), have recently also become popular.

A sigma delta ADC can be designed with switched capacitor blocks (see e.g., U.S. Pat. No. 5,198,817) or with continuous time blocks (see e.g., U.S. Pat. No. 4,926,178). There are trade offs to selecting either approach, however, and a major one for the continuous time approach is the growth of the feedback resistors in the N-level DAC as higher numbers of levels (bits of ADC resolution) are employed. This follows from the preceding paragraphs. As the value of M increases the area required for the feedback resistors grows exponentially, yet a high bit count is desirable for many reasons. For example, it improves the power and performance of the continuous time ADC and helps with jitter insensitivity and out of band noise. [Such concepts are well documented in the art and are not elaborated on here.]

FIG. 2 (background art) is a schematic block diagram depicting a conventional 3rd-order, N-level sigma delta ADC 20. While introducing a more sophisticated type of sigma delta ADC, a number of simplifications are also used in FIG. 2 for clarity. The obvious difference here from the sigma delta ADC 10 of FIG. 1 is that the sigma delta ADC 20 here has three orders of integration with feedback summing (stylistically represented as arrowed lines for orders 22*a*, 22*b*, 22*c*). The integrations are performed by op amp blocks 24*a*, 24*b*, 24*c* (with conventional feedback capacitors, an additional signal inversion, etc. being omitted to avoid obscuring more germane features). When combined with input resistors 26*a*, 26*b*, 26*c*, the blocks 24*a*, 24*b*, 24*c* comprise non-inverting integrators. The input resistors 26*a*, 26*b*, 26*c* have been shown distinct from the symbols used for the blocks 24*a*, 24*b*, 24*c* for emphasis and to simplify the figure. The quantizing element and portions of the feedback system are collectively represented as an ADC and DAC block 28, but with the feedback resisters shown separately as feedback resisters 30*a*, 30*b*, 30*c* for the respective orders 22*a*, 22*b*, 22*c*.

The ratios of the resistances of the feedback resisters 30*a*, 30*b*, 30*c* in FIG. 2 are R, 4R, 8R. In a sigma delta ADC it is usually desirable to scale the DAC feedback resistors by factors of 2 or 4. This helps, for instance, to stabilize the feedback loops. Other techniques are known aside from those using resistors (see e.g., U.S. Pat. No. 6,891,488), but since resistors can be extremely linear their use is often desirable.

If the sigma delta ADC 20 is one where N=1, the feedback resisters 30*a*, 30*b*, 30*c* can be simply as shown. However, to represent embodiments where N>1, the feedback resisters 30*a*, 30*b*, 30*c* are shown in FIG. 2 in stylized manner, and are as described in the next paragraph.

FIGS. 3*a–b* (background art) are schematic block diagrams that depict sets of feedback resisters 30*a* for exemplary 2-bit and 3-bit (M=2 and M=3) embodiments of the sigma delta ADC 20. In FIG. 3*a* three 3R resisters are employed, and in FIG. 3*b* seven 7R resisters are employed. Since it is desirable to make M as large as possible to help with a number of design parameters, the M=2 and M=3 embodiments in FIGS. 3*a–b* are illustrative of the principle rather than of circuits likely to be encountered. Using M=5 (or greater) is often desirable, and this means that the feedback resisters 30*a*, 30*b*, 30*c* for such an embodiment would each actually be implemented as 31 ($2^5-1$) resistors having value 32R, plus 31 resistors having value 4*32R, plus 31 resistors having value 8*32R.

Obviously, as M grows in value things can get out of control and limit how large M can be as a practical matter. Some noteworthy issues arising out of this are more complicated circuit design, larger circuit footprint requirements, and increased manufacturing difficulty. For the poor circuit designer this parade of horribles is further compounded because R should not be too small or power dissipation can easily also get out of control.

Accordingly, what is needed is an improved arrangement of feedback resisters in the sigma delta ADC. Such an arrangement should preferably permit the use of one or more levels, yet concurrently permit reduced resistor sizing and current consumption.

Before turning to a discussion of the present invention, we digress briefly to cover some concepts that will be helpful later. FIGS. 4*a–b* (prior art) are schematic diagrams depicting the relevant features of two conventional DAC designs.

FIG. 4*a* shows an 8-bit weighted-resister DAC. This type of DAC is widely considered to be the simplest in principle. Unfortunately, the weighted-resister DAC is an example of where principle and practicality do not well coincide and this design is rarely used in actual practice. One problem here, for example, is the complexity of accurately manufacturing the feedback resisters. Only one resister per bit is required but each has a different value (2R, 4R, . . . , 256R in FIG. 4*a*) and these must be precise. Furthermore, there is a wide range in the currents that then flow through the feedback resisters (a ratio of 128:1 between 2R and 256R in FIG. 4*a*). These factors make designing weighted-resister DACs difficult and there actual use inefficient.

FIG. 4*b* shows an 8-bit R-2R ladder DAC. While conceptually more complex, the R-2R ladder DAC is widely used today. The R-2R ladder DAC uses two resisters per bit, and these can all be of two values (R, 2R) which are easily manufactured and have merely a 2:1 ratio in currents. The left-most 2R resister in FIG. 4*b* should be noted. It is connected to ground and thus constitutes a path for "waste" current."

With reference again to FIG. 2, it is the feedback resisters 30*a*, 30*b*, 30*c* there that are what would typically be implemented as the resisters (R, 2R of FIG. 4*b*), or less typically as the resisters (2R, 4R, . . . , 256R in FIG. 4*a*).

The above discussion of DACs is by no means a complete one, and is provided here only as background to the present concern of improving sigma delta ADCs. A key point to be appreciated here, however, is that the feedback resisters in the DAC sub-section significantly effect the circuit size and performance of a sigma delta ADC.

DISCLOSURE OF INVENTION

Accordingly, it is an object of the present invention to provide an improved arrangement of feedback resisters for the sigma delta analog-to-digital converter (ADC).

Briefly, one preferred embodiment of the present invention is a sigma delta ADC to convert an analog converter input signal to a digital converter output signal. Multiple integrator stages are provided that include at least a first and a separate final stage. Each integrator stage receives an analog input signal and an analog feedback signal, and an output for providing an integrated signal. The integrator stages are serially ordered to receive the converter input signal as the analog input signal received by one or more stages and to then receive respective the integrated signals of one or more of all but the final stage as respective analog input signals to the subsequent integrator stages. A quantizer then receives the integrated signal of the final stage, or multiple of the stages, and provides the converter output signal. A feedback system also receives the converter output signal and provide respective analog feedback signals to each of the second inputs of the integrator stages. The feedback system particularly includes resisters arrayed so that at least one is in the paths of all of the analog feedback signals and others are only in the paths of each individual analog feedback signal.

Briefly, another preferred embodiment of the present invention is a method for sigma delta conversion of an analog converter input signal to a digital converter output signal. The converter input signal is integrated into an integrated signal and further integrated into a further-integrated signal (further integrated more than once, if desired). The ultimate further-integrated signal is then quantized into the converter output signal. A portion of the converter output signal is also converted into multiple analog feedback signals that are respectively fed back into the integrating and further-integrating operations by passing them through resisters arrayed so that all of the analog feedback signals pass through at least one resister and each individual analog feedback signal passes individually through other resisters.

An advantage of the present invention is that it permits reducing the size of the resister area in a sigma delta ADC.

Another advantage of the invention is that it permits reducing the current used in a sigma delta ADC.

Another advantage of the invention is that it is particularly suitable for use in higher order sigma delta ADCs.

Another advantage of the invention is that it is suitable for use in sigma delta ADCs employing M-bit conversion, particularly if M>1.

And another advantage of the invention is that it can be employed with techniques already widely used in sigma delta ADCs, such as equally weighted codings (e.g., thermometer code) and with dynamic element matching (DEM) algorithms (e.g., data weighted averaging (DWA)).

These and other objects and advantages of the present invention will become clear to those skilled in the art in view of the description of the best presently known mode of carrying out the invention and the industrial applicability of the preferred embodiment as described herein and as illustrated in the figures of the drawings.

BRIEF DESCRIPTION OF THE DRAWINGS

The purposes and advantages of the present invention will be apparent from the following detailed description in conjunction with the appended figures of drawings in which.

In the various figures of the drawings, like references are used to denote like or similar elements or steps.

BEST MODE FOR CARRYING OUT THE INVENTION

Figure 1:
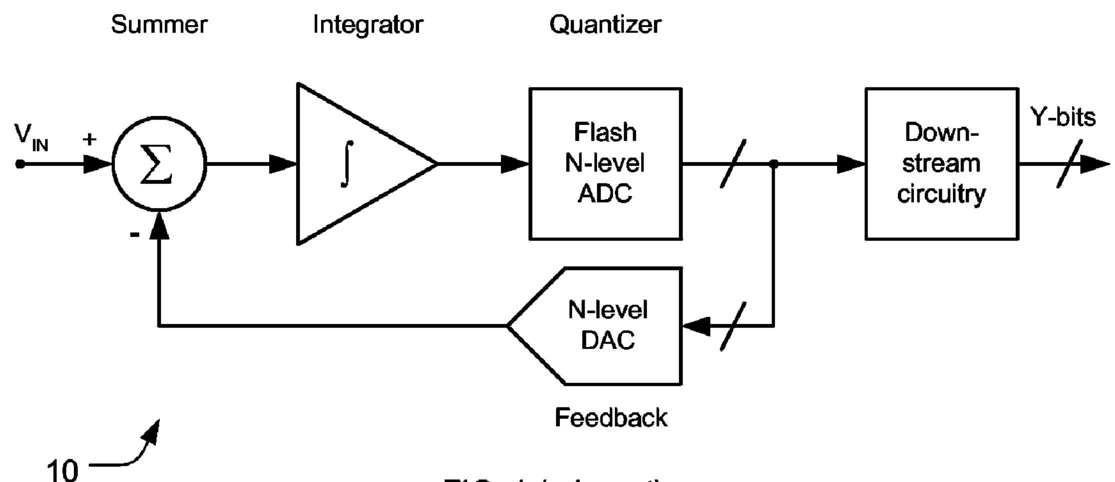
FIG. 1 (prior art) is a schematic block diagram depicting a conventional 1st-order, N-level sigma delta ADC.

A preferred embodiment of the present invention is a sigma delta analog-to-digital converter (ADC). As illustrated in the various drawings herein, and particularly in the view of FIG. 5, preferred embodiments of the invention are depicted by the general reference character 100.

Figure 5:
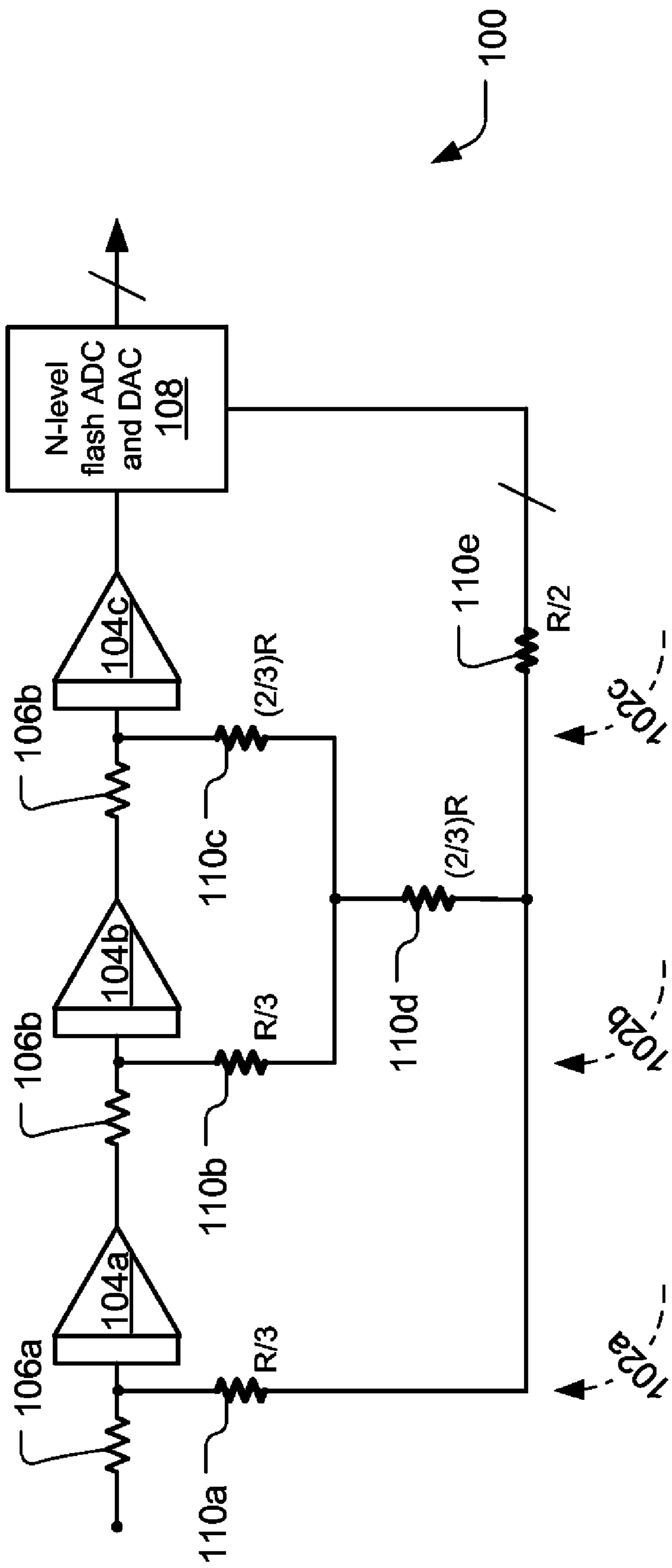
FIG. 5 is a schematic block diagram depicting a 3rd-order, N-level sigma delta ADC that is in accord with the present invention.

FIG. 5 is a schematic block diagram depicting a 3rd-order, N-level sigma delta ADC 100 that is in accord with the present invention. The sigma delta ADC 100 has three orders of summing and integration (stylistically represented with arrowed lines for orders 102*a*, 102*b*, 102*c*). Non-inverting integrators are provided by op amp blocks 104*a*, 104*b*, 104*c* combined with input resistors 106*a*, 106*b*, 106*c* (conventional feedback capacitors, an additional signal inversion, etc. are omitted for clarity). As was also done in FIG. 2, the input resistors 106*a*, 106*b*, 106*c* here are shown distinct from the blocks 104*a*, 104*b*, 104*c* for emphasis. Similarly, the quantizing element and portions of the feedback system are collectively represented as an ADC and DAC block 108 with the feedback resisters for the DAC shown separately.

Figure 2:
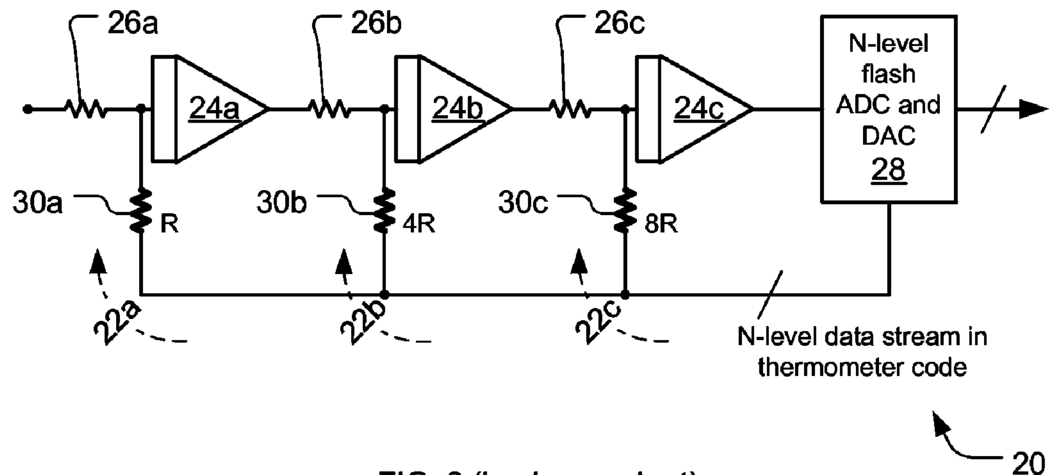
FIG. 2 (background art) is a schematic block diagram depicting a conventional 3rd-order, N-level sigma delta ADC.
Figure 3A:
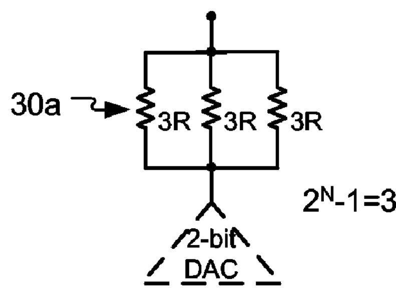
FIGS. 3*a–b* (background art) are schematic block diagrams that depict sets of feedback resisters for exemplary 2-bit and 3-bit (M=2 and M=3) embodiments of the sigma delta ADC of FIG. 2.
Figure 3B:
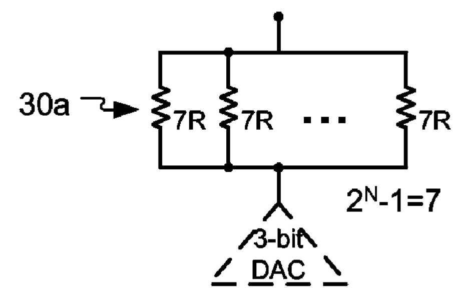
Figure 4A:
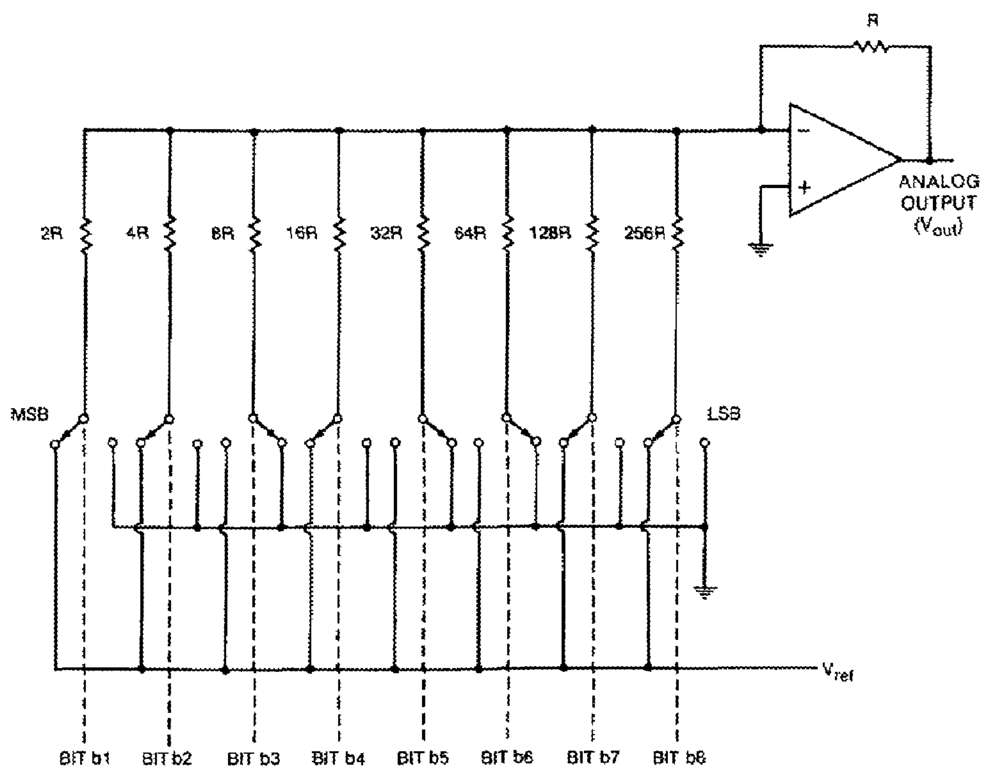
FIGS. 4*a–b* (prior art) are schematic diagrams depicting the relevant features of two conventional DAC designs.
Figure 4B:
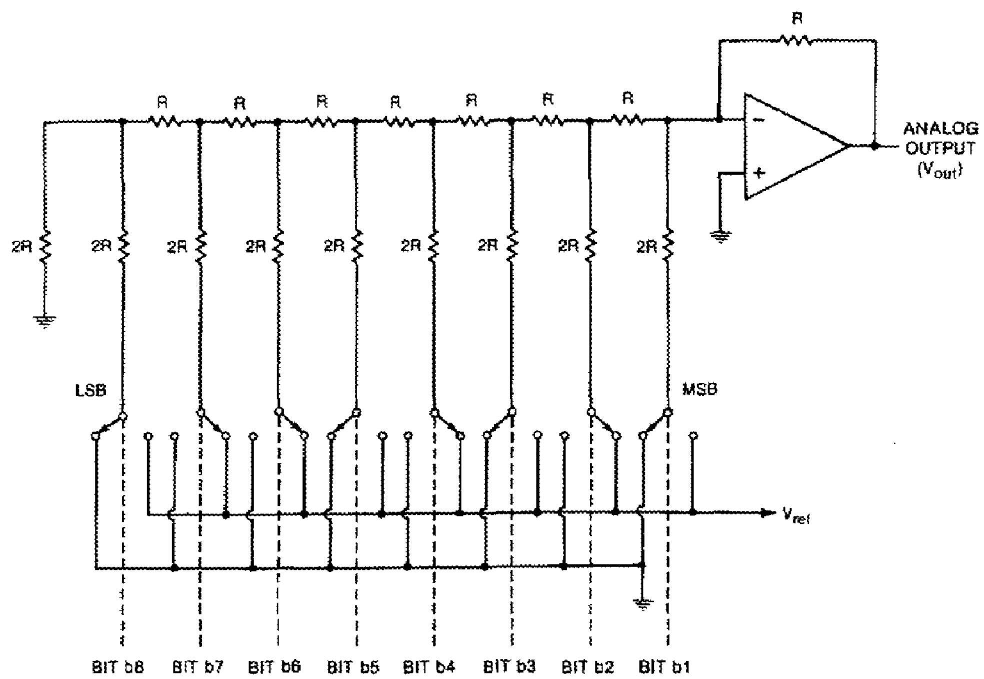

As can readily be observed by comparison of FIG. 5 with FIG. 2, which both depict N-level, 3rd-order systems having effective feedback resistance ratios of R, 4R, 8R, the DAC feedback resisters 110*a*, 110*b*, 110*c*, 110*d*, 110*e* of the inventive sigma delta ADC 100 are markedly different in quantity and values than the feedback resisters 30*a*, 30*b*, 30*c* of the conventional sigma delta ADC 20. Simply stated, the present invention uses a resistor array in the feedback paths instead of individual resistor or resister sets in the individual feedback paths.

One way to conceptually grasp this aspect of the present invention is to consider the conventional R-2R DAC, only here extended to providing feedback to the multiple integration stages of the sigma delta ADC 100. Each feedback path can thus be considered as a current path where adjustment of the R-2R feedback dividers motivates the selection of the resistor values.

Stated alternately, one way to visualize this is to first consider the feedback resisters 30*a*, 30*b*, 30*c* of FIG. 2. These can each respectively be resister sets that are part of a R-2R DAC driving the respective feedback loops (orders 22*a*, 22*b*, 22*c*). Each individual R-2R resister sets in each feedback loop here can be regarded as extending perpendicular to the plain of the figure. Use of resister sets in this manner has long been conventional in the art. In contrast, in FIG. 5 it can clearly be seen that the DAC feedback resisters 110*a*, 110*b*, 110*c*, 110*d*, 110*e* form an array lying in the plain of the figure, with some parts of this resister array being common to all of the feedback loops.

Unlike the conventional R-2R DAC, in one aspect, however, the present invention does not need to include a "waste" current path to ground. For example, the sigma delta ADC 100 in FIG. 5 does not have anything equivalent to the left-most 2R resistor in FIG. 2.

As can also be observed, the values used for the feedback resisters 110*a*, 110*b*, 110*c*, 110*d*, 110*e* are much smaller than the values of the feedback resisters 30*a*, 30*b*, 30*c* of the conventional sigma delta ADC 20. This helps with the area and bandwidth capabilities of the resistors themselves. The resulting resister array also has intermediate nodes with a low Thevenin impedance, which further helps the resistor bandwidth.

The present approach is easily extended to higher order modulators using similar concepts to R-2R ladders even if the ratios are not 2× at each stage. For example, the resistor ratios used in FIG. 5 could be adjusted to provide different gain ratios by monitoring the required ADC current levels and modifying the resistor values used.

Figure 6:
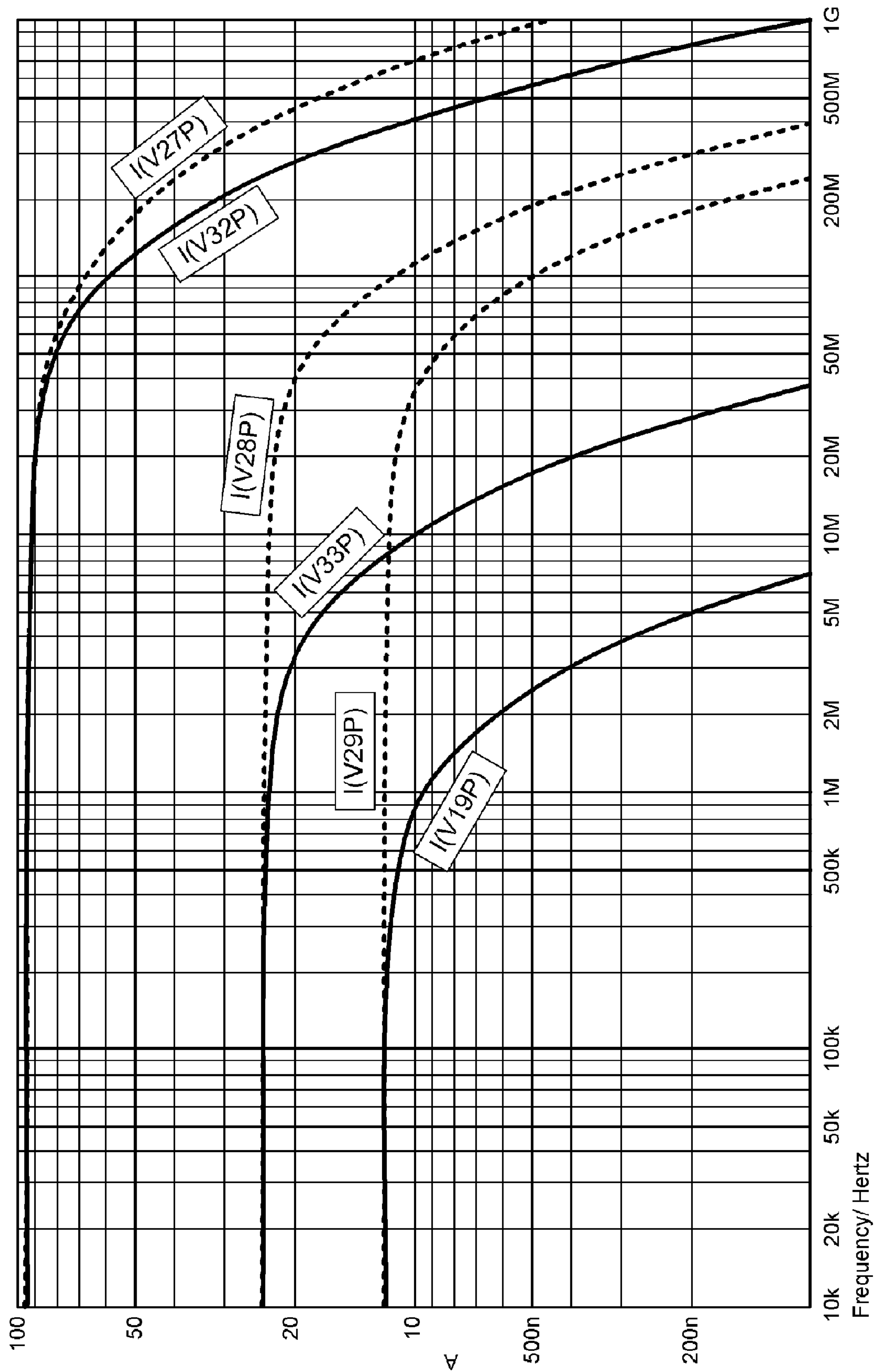
FIG. 6 is a graph of simulations of the relative bandwidth of the feedback resistors.

FIG. 6 is a graph of simulations of the relative bandwidth of some example feedback resistors cases. Five-segment R-C models were used for each case with actual process values for a high-volume foundry. In FIG. 6, there are three distinct current values with the one having higher bandwidth being that of the present invention for each current value.

One disadvantage of the new approach is that the second and third integrators make noteworthy noise contributions to the input. This means that the power dissipation of these integrators cannot be lowered too far because it is necessary to keep their noise low to control overall system noise. However, the added power dissipation required by these integrators is not as significant as the power that can be saved by increasing the value of R in the feedback resistors. This also allows for higher N-level values in the flash ADC/DAC before parasitic capacitance in the feedback resistors becomes a limiting factor, and that helps overall modulator performance. Furthermore, these techniques also easily extend to differential circuitry.

While various embodiments have been described above, it should be understood that they have been presented by way of example only, and that the breadth and scope of the invention should not be limited by any of the above described exemplary embodiments, but should instead be defined only in accordance with the following claims and their equivalents.

INDUSTRIAL APPLICABILITY

The present sigma delta ADC 100 is well suited for application in modern electronic systems. The invention permits reducing the size of the resister area needed as well reducing the current used. The invention is also particularly suitable for use in higher order devices, and also for designs employing N-level conversion, particularly when N>1. Both of these latter considerations are of particular present importance, since industry is currently turning higher order and higher designs to improve the performance of sigma delta ADCs.

The sigma delta ADC 100 is especially noteworthy because it can be used with and compliment other techniques that are already widely used in sigma delta ADCs, such as equally weighted codings (e.g., thermometer code) and dynamic element matching (DEM) algorithms (e.g., data weighted averaging (DWA)).

For the above, and other, reasons, it is expected that the sigma delta ADC 100 of the present invention will have widespread industrial applicability and it is therefore expected that the commercial utility of the present invention will be extensive and long lasting.

What is claimed is:

1. A sigma delta analog-to-digital converter comprising:

a plurality of integrator stages for generating an output signal, wherein each integrator stage comprises a respective input for receiving a respective feedback signal;

a feedback network coupled between said output and said respective inputs of said plurality of integrator stages, wherein said feedback network comprises a plurality of feedback paths, wherein said plurality of feedback paths comprises a respective feedback path for each of said plurality of integrator stages, wherein a proper subset of said plurality of feedback paths share at least one feedback component, where said at least one feedback component is operable to communicate an analog feedback signal, and wherein said at least one feedback component comprises a resistor.

2. The sigma delta analog-to-digital converter of claim 1, wherein said output signal comprises an analog output signal, and wherein said sigma delta analog-to-digital converter further comprises:

a quantizer component for converting said analog output signal to a digital output signal.

3. The sigma delta analog-to-digital converter of claim 1, wherein said plurality of integrator stages are serially coupled to one another.

4. The sigma delta analog-to-digital converter of claim 1, wherein said feedback network comprises at least one digital-to-analog converter for converting said digital output signal to an analog feedback signal for at least one of said plurality of integrator stages.

5. The sigma delta analog-to-digital converter of claim 1, wherein said plurality of feedback paths each comprise at least one exclusive feedback component.

6. The sigma delta analog-to-digital converter of claim 5, wherein said at least one exclusive feedback component comprises a resistor.

7. The sigma delta analog-to-digital converter of claim 1, wherein said feedback network comprises a first set of feedback paths sharing a first shared feedback component, and wherein said feedback network further comprises a second set of feedback paths sharing a second shared feedback component.

8. The sigma delta analog-to-digital converter of claim 7, wherein said first shared feedback component comprises a first resistor, and wherein said second shared feedback component comprises a second resistor.

9. The sigma delta analog-to-digital converter of claim 7, wherein said first set of feedback paths shares at least one feedback path with said second set of feedback paths.

10. A method of converting an analog signal to a digital signal, said method comprising:

integrating said analog signal using a plurality of integrator stages to generate an output signal;

converting said output signal into a plurality of feedback signals using a feedback network, wherein said feedback network comprises a plurality of feedback paths, wherein said plurality of feedback paths comprises a respective feedback path for each of said plurality of integrator stages, wherein a proper subset of said plurality of feedback paths share at least one feedback component, wherein said at least one feedback component is operable to communicate an analog feedback signal, and wherein said at least one feedback component comprises a resistor; and providing said plurality of feedback signals to respective inputs of each of said plurality of integrator stages.

11. The method of claim 10, wherein said output signal comprises an analog output signal, and wherein said method further comprises:

converting said analog output signal to a digital output signal using a quantizer component.

12. The method of claim 11, further comprising:

converting said digital output signal to an analog feedback signal; and generating said plurality of feedback signals from said analog feedback signal.

13. The method of claim 10, wherein said plurality of integrator stages are serially coupled to one another.

14. The method of claim 10, wherein said plurality of feedback paths each comprise at least one exclusive feedback component.

15. The method of claim 14, wherein said at least one exclusive feedback component comprises a resistor.

* * * * *